(12) United States Patent
Giaconi et al.

(10) Patent No.: US 9,178,521 B2
(45) Date of Patent: Nov. 3, 2015

(54) FAST SETTLING MIXED SIGNAL PHASE INTERPOLATOR WITH INTEGRATED DUTY CYCLE CORRECTION

(71) Applicants: Stefano Giaconi, Phoenix, AZ (US); Mingming Xu, Phoenix, AZ (US)

(72) Inventors: Stefano Giaconi, Phoenix, AZ (US); Mingming Xu, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/194,249

(22) Filed: Feb. 28, 2014

(65) Prior Publication Data

US 2015/0249454 A1 Sep. 3, 2015

(51) Int. Cl.
*H04L 7/00* (2006.01)
*H03L 7/081* (2006.01)
*H04L 7/033* (2006.01)
*H03M 1/74* (2006.01)
*H03M 1/66* (2006.01)
*H03M 1/10* (2006.01)
*H03K 5/135* (2006.01)
*H03K 5/00* (2006.01)
*H03M 7/30* (2006.01)

(52) U.S. Cl.
CPC ............ *H03L 7/0814* (2013.01); *H04L 7/0332* (2013.01); *H03K 5/135* (2013.01); *H03K 2005/00058* (2013.01); *H03M 1/1023* (2013.01); *H03M 1/66* (2013.01); *H03M 1/742* (2013.01); *H03M 1/745* (2013.01); *H03M 7/3006* (2013.01)

(58) Field of Classification Search
CPC ....... H03M 1/742; H03M 1/745; H03M 1/66; H03M 1/1023; H03M 7/3006; H03M 1/06; H03K 5/135; H03K 2005/00058; H03K 5/1565; G06F 1/04
USPC ................................... 375/365, 259; 341/144
See application file for complete search history.

(56) References Cited

U.S. PATENT DOCUMENTS

2004/0075462 A1\* 4/2004 Kizer et al. ..................... 326/29
2010/0109734 A1\* 5/2010 Rylov ............................ 327/256

\* cited by examiner

*Primary Examiner* — Leila Malek
(74) *Attorney, Agent, or Firm* — Blakely, Sokoloff, Taylor & Zafman LLP (57) ABSTRACT

Described is an apparatus which comprises: a current steering digital-to-analog converter (DAC) to receive a digital bus to control current steering; a switch capacitor network to integrate currents from the DAC, the switch capacitor network having switches which are controllable by a plurality of digital clock signals; an output stage to compare the integrated currents against at least two threshold voltages and to generate an output signal; and a duty cycle corrector (DCC) operable to adjust the at least two threshold voltages to modify duty cycle of the output signal.

20 Claims, 6 Drawing Sheets

FAST SETTLING MIXED SIGNAL PHASE INTERPOLATOR WITH INTEGRATED DUTY CYCLE CORRECTION

BACKGROUND

Phase Interpolators (PIs) are used in high speed input-output circuits (I/Os). For example, PIs may be used in conjunction with a digital Low Pass Filter (LPF) to produce a digital Clock and Data Recovery (CDR) circuit, or by themselves to enable Design-for-Test (DFT) features such as the internal eye monitor system. Resolution, linearity, and jitter performance are some characteristics considered when designing a PI.

Traditional PIs are analog circuits using a Gilbert cell to mix two quadrature sinusoidal input clocks to produce a sinusoidal output clock with a desired phase offset. The sinusoidal output clock is classified as an analog clock. Many processors use digital clocks instead of analog clocks. Digital clocks refer to clock signals that have purely digital CMOS levels. To preserve linearity and step size, PIs using digital clocks convert the input digital CMOS level clocks to pseudo-sinusoidal (or triangular) shape for mixing. At the output of the PI, the sinusoidal shaped output is converted back to CMOS level. The input and output signal conversions use significant amount of power and area, and decrease the jitter performance and resolution of the PI.

To take advantage of purely digital CMOS clock, digital PIs (DPIs) mix different buffered versions of the input CMOS clocks to achieve a required delayed version of the CMOS clock output. However, due to variation of process corner, supply voltage and temperature (i.e., PVTs), many more phases than required are generated by the DPI. During a calibration procedure, only a sub-set of the phases are mapped for use in operation. This creates an overhead in area, power and calibration time. For example, each single phase needs to be measured and mapped at startup. Jitter performance is also compromised by such DPIs because the inverters used to produce the different slopes have slow transition times creating opportunity to inject power noise into the signal. Very high resolution is also very difficult to achieve.

Another issue related to the DPI is duty-cycle control. For example, to control duty cycle of the output signal from the DPI, the DPI slows down the slopes of the internal signal edges to compensate for duty cycle distortion. A reduced rising/falling slope leads to increased jitter performance and area.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

The embodiments describe a Fast Settling Digital Phase Interpolator (FSPI) with integrated duty-cycle correction (DCC). In one embodiment, the FSPI produces a pseudo-differential CMOS clock output with a digital controlled delay from a quadrature CMOS pseudo-differential clock input. In one embodiment, the FSPI produces a high resolution low power and area scalable CMOS-in CMOS-out phase interpolator circuit.

In one embodiment, the FSPI uses a current steering digital-to-analog converter (DAC) and switches to produce at least two current levels which are integrated for three different phases onto two different capacitors. In one embodiment, the fourth phase is used to reset the capacitors and eliminate memory from the current phase to enable fast tracking. In one embodiment, a pair of comparators is used to compare the voltage levels at the capacitors with two adaptable voltage levels to produce two independent signals which represent the rising and falling edges of the output CMOS clock. In one embodiment, a closed DCC loop is integrated to the FSPI to dynamically adapt the reference voltage value to eliminate duty cycle distortion (DCD). In one embodiment, an output clock is produced by driving those signals to a set-reset (SR) latch. The FSPI of the embodiments is a mixed signal PI which includes analog circuits such as DACs and comparators, along with digital circuits such as an SR Latch.

There are many technical effects of the embodiments. Some non-limiting technical effects include the following. The embodiment of FSPI is scalable and efficient in terms of area and power, compared to the analog implementation. Compared to the traditional digital PI (DPI), the area and power are smaller, because FSPI may not need more than double the phases needed to produce a calibrated set of phases. The embodiment of the PI is fast settling. In one embodiment, FSPI includes an apparatus to reset phase on the integration capacitors which enables the FSPI to clear out any memory from the previous phase, eliminating the jitter accumulation as well as the need for slow common mode control. In such an embodiment, the FSPI can change code more quickly than traditional DPIs, thus making the FSPI ideal for high speed serializer/de-serializer applications.

In one embodiment, the FSPI includes an integrated DCC circuit. In one embodiment, the FSPI includes a hook-up for DCC which does not degrade the jitter performance of the FSPI. The hook-up for DCC allows different circuits external to the FSPI to control the duty cycle of the output CMOS level signals. In one embodiment, FSPI exhibits better jitter performance than the traditional DPI. Traditional DPIs use inverters with weakened P-type or N-type MOS devices to produce delayed version of the clock. During slower transition of internal signals received by the inverters, the traditional DPIs are more sensitive to noise, leading to a more "jittery" behavior. During slower transition of the internal signals received by the inverters, the traditional DPIs use more power. During changes in transition slopes, the traditional DPIs change jitter performance depending on the phase which results in an inconsistent behavior for jitter budgeting purpose. In one embodiment, the FSPI uses current sources for its DAC and reference generation to filter out noise coming from the power supply resulting in low jitter, low power, and lower area.

In one embodiment, the FSPI allows for simpler calibration procedure than traditional DPIs. In a traditional DPI, each single phase is measured and a table of "selected" phases is compiled at start-up. Linearity is largely realized by design in the FSPI. Another technical effect of the embodiment of FSPI is that the FSPI can easily increase the PI resolution if needed. Compared to traditional DPIs, the FSPI of the embodiment allows for an easy way of increasing the resolution if needed, by expanding the DAC size and increasing the capacitance of the integrating capacitors.

The FSPI of the embodiments also exhibits less sensitivity to process variation than traditional DPIs. One reason for less sensitivity to process variation is the use of a constant current generator by the FSPI to integrate current on a metal capacitor. In such an embodiment, device variation becomes much less critical. The FSPI of the embodiments is also a highly portable design. For example, current integration used by the FSPI allows for easy porting of the design to different technology process nodes because increase in metal capacitance and resistance of interconnect may not be critical for this embodiment. The embodiments of the FSPI may not rely on the trans-conductance (gm) of the devices because current is integrated on the metal capacitors which are less sensitive to variation.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and the include plural references. The meaning of in includes in and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nanotubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

Figure 1:
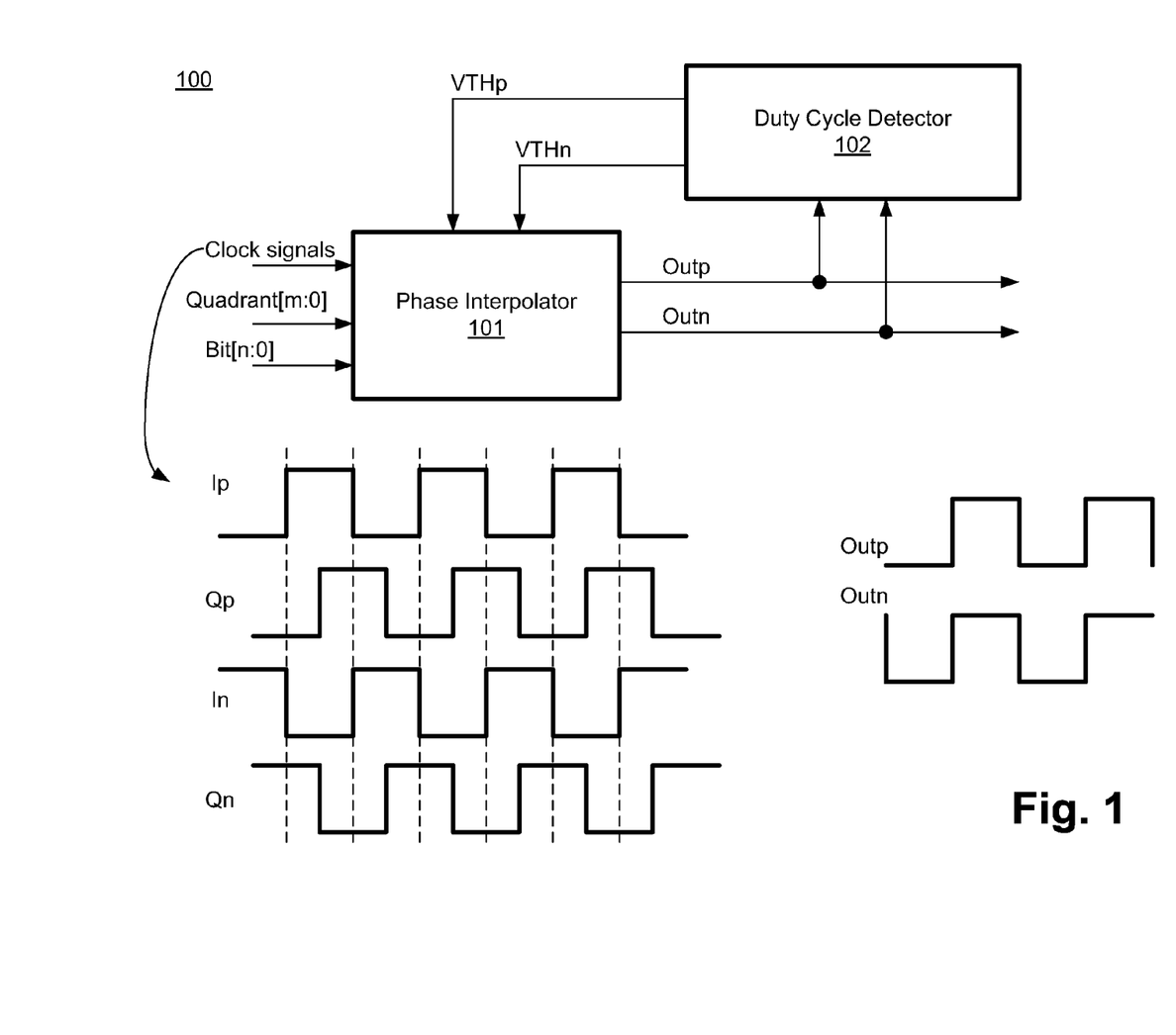
FIG. 1 illustrates a high-level circuit with a phase interpolator (PI) with integrated duty cycle correction (DCC), and a duty cycle detector (DCD), according to one embodiment of the disclosure.

FIG. 1 illustrates a high-level circuit 100 with PI 101 (also referred to as FSPI) having an integrated DCC circuit, and DCD 102 (Duty Cycle Detector), according to one embodiment of the disclosure. In one embodiment, PI 101 receives two differential input Clock signals—Ip, Qp, In, and Qn, where Ip and In are a first set of differential clock signals and Qn and Qp are a second set of differential clock signals. The input Clock signals are CMOS level signals i.e., digital clock signals. The input Clock signals are quadrature clock signals such that each clock is separated from the other by 90° phase. For example, Qp is separated from Ip by 90° phase, In is separated from Qp by 90° phase, and Qn is separated by In by 90° phase.

In one embodiment, PI 101 also receives a digital bus Bit[n:0], where 'n' is an integer. In one embodiment, Bit[n:0] is used to adjust phase of the output signals Outp and Outn (which are differential signals). In one embodiment, PI 101 also receives a Quadrant bus signal (e.g., Quadrant[m:0], where 'm' is an integer). In one embodiment, Quadrant[m:0] indicates which phase in the quadrant controls phase of the output clock relative to the input clock signals. The embodiments are explained with reference to m=2 i.e., four quadrants—00, 01, 10, and 11. However, the embodiments are applicable to any even number of quadrants, for example, octave having eight quadrants, sixteen quadrants, etc. In one embodiment, the different phases for interpolation are divided in four quadrants and each of them is further divided into 'n' different phase positions (i.e., Bits) leading to a total of 4n different phases. For example, if n=64, total number of PI phases are 256.

In one embodiment, PI 101 receives at least two threshold voltages VTHp and VTHn for correcting duty cycle of the output signals Outp and Outn. In one embodiment, DCC 102 monitors the duty cycle of Outp and Outn and generates VTHp and VTHn to adjust duty cycle of signals Outp and Outn. In one embodiment, PI 101 generates signals Outp and Outn as CMOS level signals.

Figure 2:
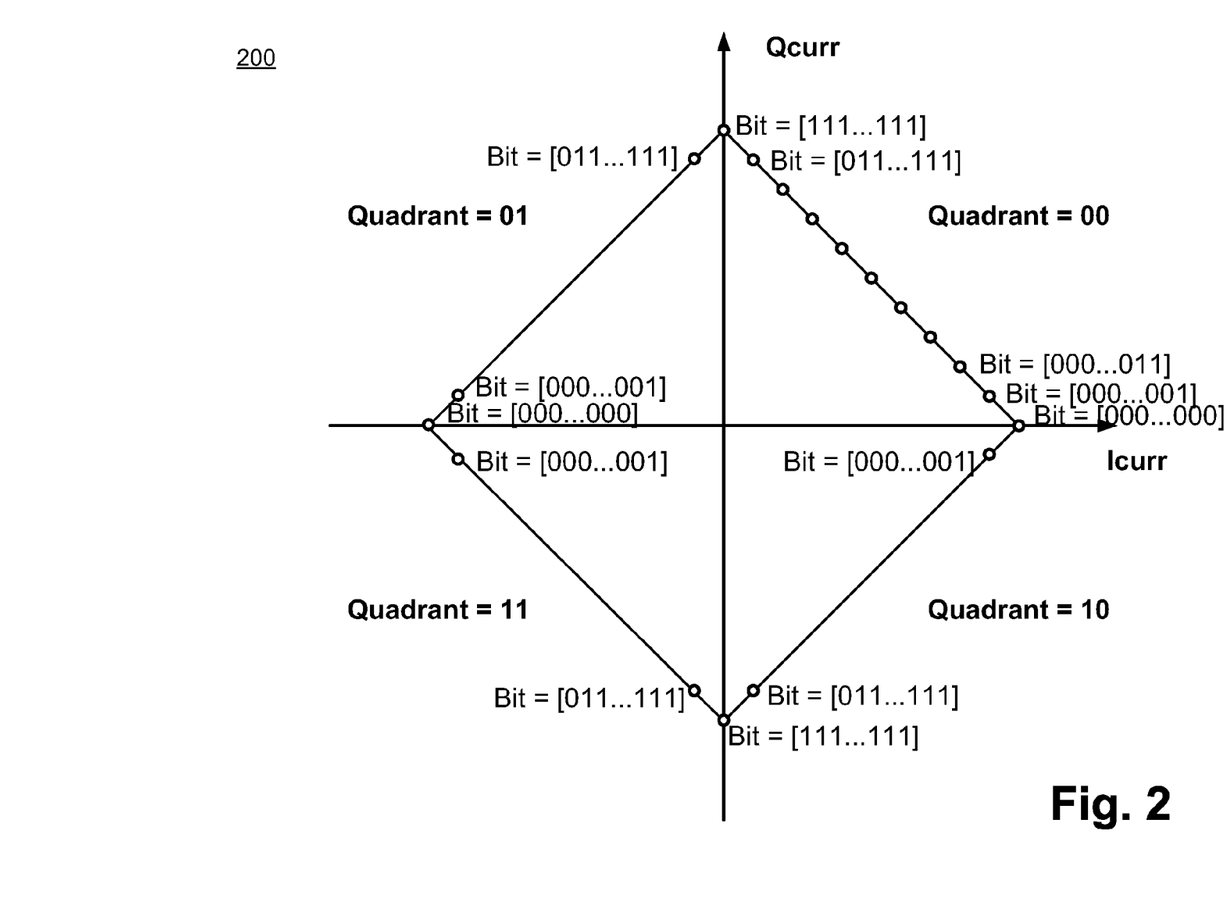
FIG. 2 illustrates a 2-bit quadrant for phase organization by the PI of FIG. 1, according to one embodiment of the disclosure.

FIG. 2 illustrates a 2-bit quadrant 200 for phase organization by the PI of FIG. 1, according to one embodiment of the disclosure. It is pointed out that those elements of FIG. 2 having the same reference numbers (or names) as the elements of any other figure can operate or function in any manner similar to that described, but are not limited to such.

Here, x-axis is Icurr (also referred here as first current) and y-axis is Qcurr (also referred as the second current). Icurr and Qcurr are generated by a plurality of DACs each of which has a switch to steer current into nets carrying Icurr and Qcurr, where the switches of the DACs are operable to be controlled by Bit[n:0]. For m=2, there are four quadrants-00, 01, 11, and 10. In one embodiment, the phase progression for Quadrant=00 follows the pattern: Bit=[000 . . . 000], Bit=[000 . . . 001] . . . Bit[011 . . . 111] and Bit[111 . . . 111]. As Bit transitions from [000 . . . 000] to [111 . . . 111] in quadrant [00], 90° phase adjustment in Outp and Outn is achieved.

In one embodiment, the phase progression for Quadrant= [01] follows the pattern: Bit=[111 . . . 111], Bit=[011 . . . 111], . . . Bit=[000.001]. As Bit transitions from [111 . . . 111] to [000 . . . 000] in Quadrant=[01], 90° phase adjustment in Outp and Outn is achieved. In one embodiment, the phase progression for Quadrant=[11] follows the pattern: Bit= [000 . . . 000], Bit=[000 . . . 001], . . . Bit=[011 . . . 111]. As Bit transitions from [111 . . . 111] to [000 . . . 000] in Quadrant= [11], another 90° phase adjustment in Outp and Outn is achieved. In one embodiment, the phase progression for Quadrant=[10] follows the pattern: Bit=[111 . . . 111], Bit= [011 . . . 111], . . . Bit=[000 . . . 001], to complete a full 360 degree rotation covering every single PI step.

Figure 3:
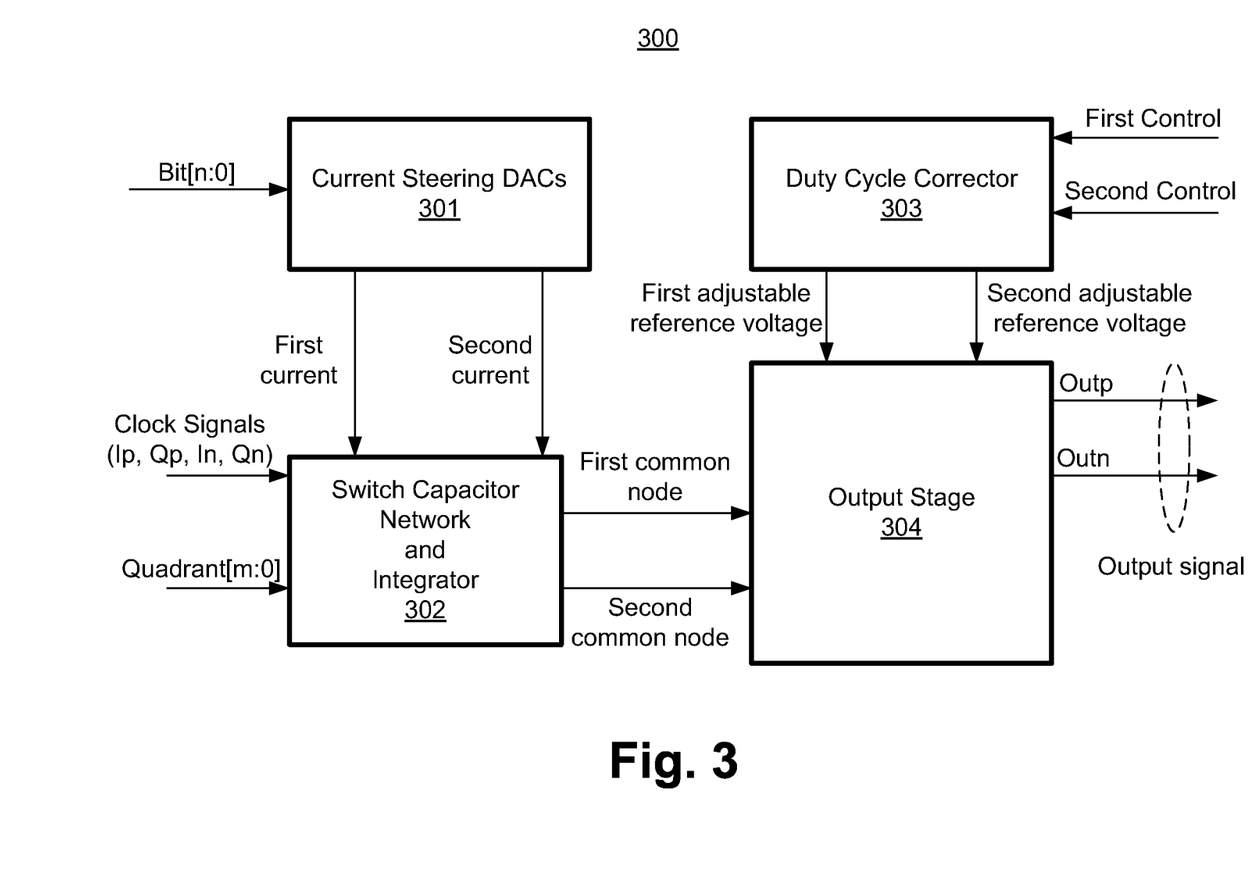
FIG. 3 illustrates a high-level circuit of the PI, according to one embodiment of the disclosure.

FIG. 3 illustrates a high-level circuit 300 of PI 101, according to one embodiment of the disclosure. It is pointed out that those elements of FIG. 3 having the same reference numbers (or names) as the elements of any other figure can operate or function in any manner similar to that described, but are not limited to such.

In one embodiment, circuit 300 comprises Current Steering DACs 301, Switch Capacitor Network and Integrator 302, Duty Cycle Corrector 303, and Output Stage 304. In one embodiment, Current Steering DACs 301 receive the digital bus Bit[n:0] and provides output current as First current (i.e., Icurr) and Second current (i.e., Qcurr). In one embodiment, depending on the code word of Bit[n:0], current is steered from the net carrying the First current to the net carrying the Second current, or vice versa.

In one embodiment, Switch Capacitor Network and Integrator 302 includes a plurality of four switches each of which are controllable by one of the clock signals—Ip, Qp, In, Qn. In one embodiment, the other two switches are controllable by a combinational logic that receives the clock signals as input and generates control signals for controlling the other two switches. In one embodiment, the plurality of switches have one end of their switches coupled to either the net carrying the First current or the net carrying the Second current. In one embodiment, the other end of the switches of the plurality of switches is coupled to at least two common nodes—First common node and a Second common node, which are discussed later with reference to FIG. 4.

Referring back to FIG. 3, in one embodiment, the voltages of the First and Second common nodes are integrated by at least two capacitors which form the integrator of Switch Capacitor Network and Integrator 302. In one embodiment, the other two switches discussed above are used to reset the voltages on the at least two capacitors. In one embodiment, the First and Second common nodes are received as inputs by Output Stage 304. In one embodiment, Output Stage 304 also receives adjustable threshold voltages—First adjustable reference voltage and Second adjustable reference voltage. In one embodiment, First and Second adjustable reference voltages are generated by Duty Cycle Corrector 303. In one embodiment, Duty Cycle Corrector 303 receives First and Second Control signals, for example, from Duty Cycle Detector 102, to adjust the voltage levels of the First and/or Second adjustable reference voltages.

In one embodiment, Output Stage 304 comprises a pair of comparators and an SR latch. In one embodiment, a first comparator from the pair of comparators compares the voltage on the First common node (i.e., integrated voltage) with the First adjustable reference voltage. In one embodiment, a second comparator from the pair of comparators compares the voltage on the Second common node (i.e., integrated voltage) with the Second adjustable reference voltage. In one embodiment, outputs of each of the first and second comparators are received as inputs to the SR latch which generates a differential output signal Outp and Outn. In one embodiment, Outp and Outn are CMOS level signals.

Figure 4:
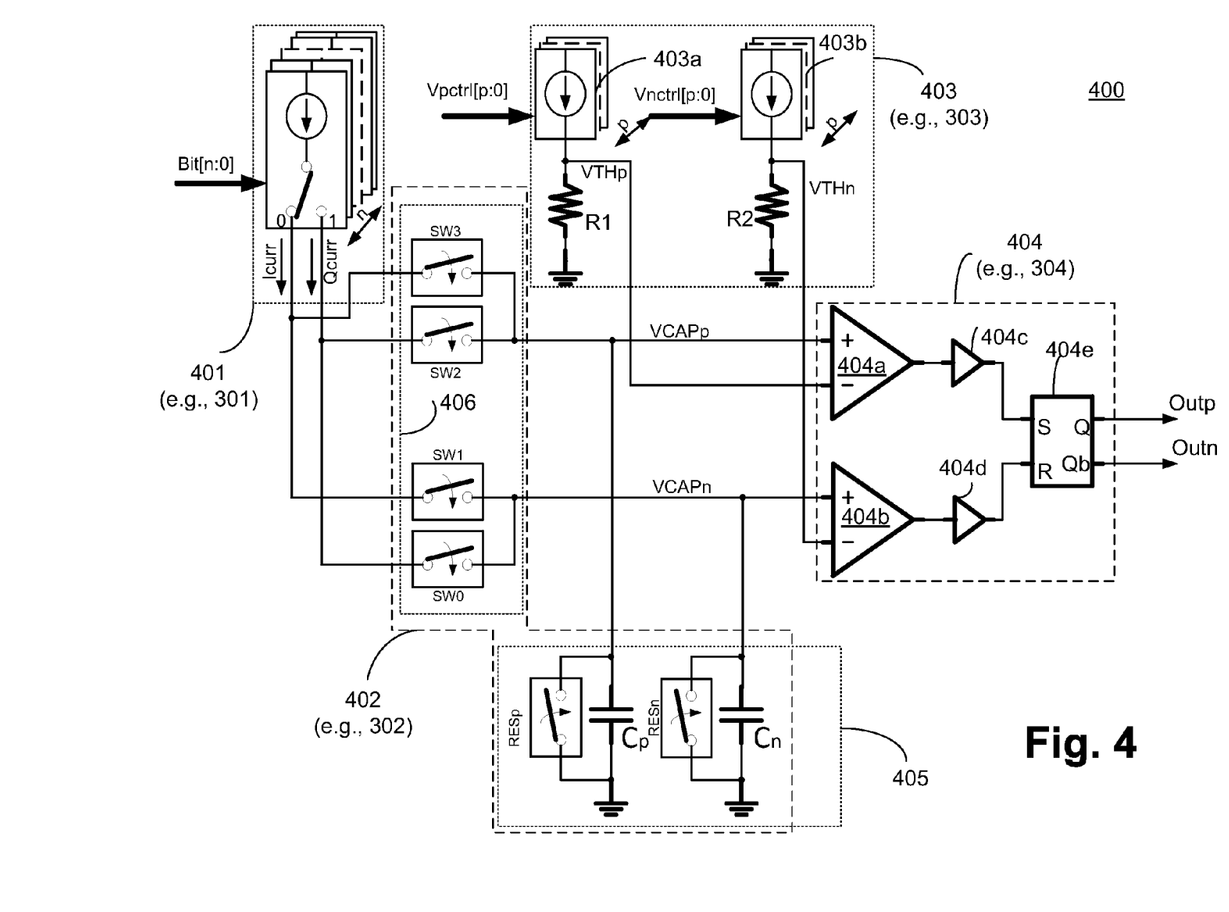
FIG. 4 illustrates a circuit of the PI with integrated DCC, according to one embodiment of the disclosure.

FIG. 4 illustrates a circuit 400 of PI 101 with integrated DCC, according to one embodiment of the disclosure. It is pointed out that those elements of FIG. 4 having the same reference numbers (or names) as the elements of any other figure can operate or function in any manner similar to that described, but are not limited to such.

In one embodiment, circuit 400 comprises 'n' Current Steering DACs 401 (e.g., 301), Switch Capacitor Network 402 (e.g., 302), Duty Cycle Corrector 403 (e.g., 303), Output Stage 404 (e.g., 304). In one embodiment, Switch Capacitor Network 402 includes a plurality of switches 406 (i.e., switches SW0-SW3) that are controllable by Clock signals, and a resettable integrator 405. In one embodiment, resettable integrator 405 comprises two capacitors Cp and Cn, and two switches RESp and RESn. In one embodiment, switch RESp is coupled in parallel to capacitor Cp while switch RESn is coupled in parallel to capacitor Cn.

In one embodiment, switches RESn and RESp short any charge on capacitors Cp and Cn to ground to remove any memory from capacitors Cn and Cp respectively. In one embodiment, capacitors Cp and Cn are implemented as metal capacitors. In one embodiment, capacitors Cp and Cn are implemented as transistors. In one embodiment, capacitors Cp and Cn are implemented as hybrid capacitors i.e., capacitors formed from a combination of metal capacitors and transistors.

In one embodiment, each of the 'n' Current Steering DACs 401 (where 'n' is an integer) comprises a current source and a switch, where the switch is controllable by Bit[n:0] digital bus. In one embodiment, each DAC of the Current Steering DACs 401 is identical to each other. In one embodiment, the switch in each DAC is operable to couple (i.e. steer) the current from the current source of the DAC to one of the output nodes Icurr and Qcurr. In one embodiment, current from the current sources of the Current Steering DACs 401 is always ON, but is steered by the code word Bit.

For example, when the control bits (i.e., Bit[n:0]) to the switches of the Current Steering DACs 401 is logical low (i.e., all bits of Bit[n:0] are '0') then current from the current sources of Current Steering DACs 401 is steered to the net providing current Icurr (i.e., first current), and when the control bits (i.e., Bit[n:0]) to the switches of Current Steering DACs 401 is logical high (i.e., all bits of Bit[n:0] are '1') then current from the current sources of Current Steering DACs 401 is steered to the net providing current Qcurr (i.e., second current).

In one embodiment, Icurr net is coupled to the first terminals of switches SW1 and SW3. In one embodiment, Qcurr net is coupled to the first terminals of switches SW2 and SW0. In one embodiment, second terminals of SW3 (also referred to as the first switch) and SW2 (also referred to as the second switch) are shorted to form VCAPp (i.e., first common node). In one embodiment, second terminals of SW1 (also referred to as the third switch) and SW0 (also referred to as the fourth switch) are shorted to form VCAPn (i.e., second common node). In one embodiment, switches SW0-SW3 are implemented as n-type pass-gates. In one embodiment, switches SW0-SW3 are implemented by p-type pass-gates. In one embodiment, switches SW0-SW3 are implemented with a combination of n-type and p-type devices (e.g., transmission gates). The switches are controllable by controlling voltage to the gate terminals of their transistors.

In one embodiment, Duty Cycle Corrector 403 comprises at least two sets of DACs 403a and 403b, each set of which is coupled in series with corresponding resistors R1 and R2 respectively. In one embodiment, resistors R1 and R2 have equal resistance. In one embodiment, resistors R1 and R2 are implemented as precision resistors. In one embodiment, resistors R1 and R2 are implemented as transistors operating in linear region. In one embodiment, DAC 403a includes 'p' number of DACs, where 'p' is an integer. In one embodiment, each of the 'p' DAC 403a includes a current source which is controllable by a digital bit from bus Vpctrl[p:0].

For example, Vpctrl[p:0] controls the current strength of the current sources of the DAC 403a. In one embodiment, DAC 403b is identical to DAC 403a and is controlled by Vnctrl[p:0]. In one embodiment, the common node of DAC 403a and resistor R1 provides the adjustable threshold voltage VTHp. In one embodiment, the common node of DAC 403b and resistor R2 provides the adjustable threshold voltage VTHn. In one embodiment, for fixed values of Vpctrl[p:0] and Vnctrl[p:0], VTHp and VTHn are constant. In one embodiment, Vpctrl[p:0] and Vnctrl[p:0] are the digital hooks to PI 101 to adjust duty cycle of Outp and Outn.

In one embodiment, Output Stage 404 receives adjustable threshold voltages VTHp (also referred to as the first adjustable threshold voltage) and VTHn (also referred to as the second adjustable threshold voltage) from Duty Cycle Corrector 403. In one embodiment, Output stage 404 also receives the integrated voltages VCAPp and VCAPn. In one embodiment, Output Stage 404 comprises first comparator 404a and second comparator 404b, buffers 404c and 404d, and SR latch 404e.

In one embodiment, first comparator 404a compares VCAPp to VTHp. In one embodiment, second comparator 404b compares VCAPn to VTHn. In one embodiment, first and second comparators (404a and 404b respectively) detect a crossing of the threshold (i.e., VTHp and VTHn) and may output a logical zero if VCAPp (or VCAPn) is below the respective threshold, and may output a logical high if VCAPp (or VCAPn) is above the respective threshold.

In one embodiment, output of first comparator 404a may be buffered by buffer 404c. In one embodiment, output of second comparator 404b may be buffered by buffer 404d. In one embodiment, outputs of buffers 404c and 404d are received as inputs by SR Latch 404e. In one embodiment, output of buffer 404c is received by the "set" (i.e., 'S') input pin of SR Latch 404e while output of buffer 404d is received by the "reset" (i.e., 'R') input pin of SR Latch 404e. In one embodiment, SR Latch 404e provides output signal Outp from output pin 'Q' of SR Latch 404e. In one embodiment, SR Latch 404e provides output signal Outn from output pin "Qb" of SR Latch 404e, where Outp and Outn form a differential CMOS level output signal.

In one embodiment, the selection of which clocks, from among clocks In, Qn, Ip, and Qp, are used to control switches SW0-SW3 depend on the value of Quadrant[m:0]. Assuming for discussion purposes only that 'm' for Quadrant is 2. In such an embodiment, for Quadrant=[00]: SW3=Ip, SW2=Qp, SW1=In, SW0=Qn, RESp=(In AND Qn) and RESn=(Ip AND Qp); Quadrant=[01]: SW3=In, SW2=Qp, SW1=Ip, SW0=Qn, RESp=(Ip AND Qn) and RESn=(In AND Qp); for Quadrant=[11]: SW3=In, SW2=Qn, SW1=Ip, SW0=Qp, RESp=(Ip AND Qp) and RESn=(In AND Qn); for Quadrant=[10]: SW3=Ip, SW2=Qn, SW1=In, SW0=Qp, RESp=(In AND Qp) and RESn=(Ip AND Qn). In one embodiment, switches RESp and RESn are controlled by a pulse with 25% duty cycle. In one embodiment, the pulse is generated by a combinational logic (not shown) which uses clock signals as input.

Figure 5:
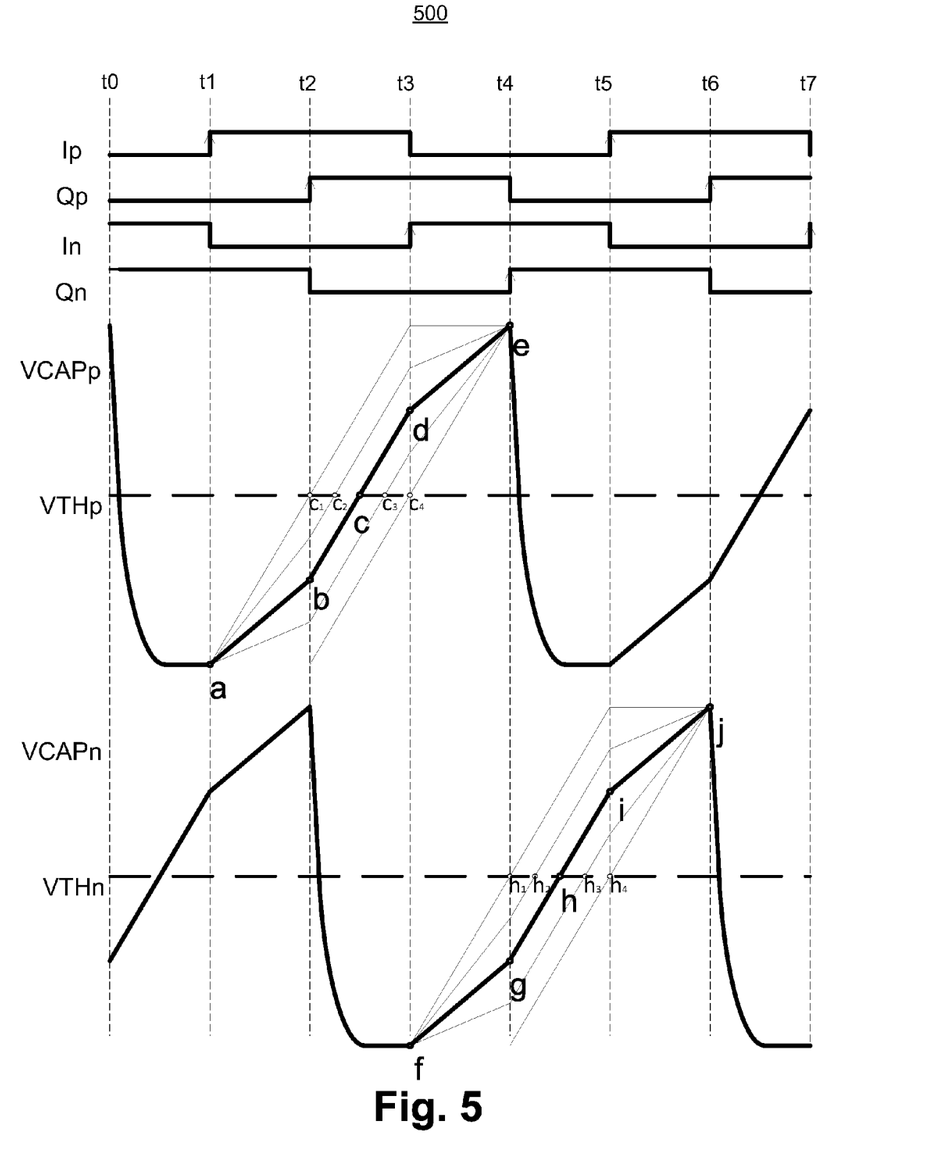
FIG. 5 illustrates a plot with waveforms showing operation of the PI, according to one embodiment of the disclosure.

FIG. 5 illustrates a plot 500 with waveforms showing operation of PI 101, according to one embodiment of the disclosure. It is pointed out that those elements of FIG. 5 having the same reference numbers (or names) as the elements of any other figure can operate or function in any manner similar to that described, but are not limited to such.

Here, x-axis is time and y-axis is voltage. The waveforms for plot 500 are shown for Quadrant=[00]. In this case SW3=Ip, SW2=Qp, SW1=In, SW0=Qn, RESp=(In AND Qn), and RESn=(Ip AND Qp). The first four waveforms from the top are input clock signals—Ip, Qp, In, and Qn. The waveforms below the input clock signals are VCAPp (i.e., voltage on the first common node) and VCAPn (i.e., voltage on the second common node).

Whenever a constant current is provided for a fixed amount of time to a capacitor the Voltage produced is regulated by the following equation:

$$\Delta V = t \cdot \Delta t / c$$

For capacitor Cp, between t0 and t1, when Ip and Qp are both '0' capacitor Cp is in reset, and all of its charge goes to ground, bringing the VCAPp voltage to 0. During this time, switch RESp is closed. Between t1 and t2, when Ip=1 and Qp=0, switch SW3 is closed and capacitor Cp starts charging (i.e., node VCAPp beings to charge up) with a constant current Icurr covering the segment 'a' to 'b' (note that the slope of this segment between t1 and t2 depends on how big Icurr is and so it depends on the bit code). During this time, switch RESp is open.

Between t2 and t3, when Ip=1 and Qp=1, switch SW3 is still closed but now switch SW2 is also closed allowing Qcurr to be added to Icurr for integration. During this time segment, the slope of VCAPp is constant (because the current is the maximum current of DAC 401 with all the DAC cells turned ON). In this case, the voltage of VCAPp goes from 'b' to 'd.'

Between t3 and t4, when Ip=0 and Qp=1, switch SW3 is open and switch SW2 is still closed covering segment 'd' to 'e.' Here, voltage at 'a' (which is '0') and voltage at 'e' are always constant independent on the DAC code (i.e., independent of value of Bit[n:0]). The crossing with the threshold VTHp instead changes linearly with the DAC code, ranging from $C_1$ to $C_4$, and covering the full quarter (i.e., Quadrant [00]).

An identical behavior is used for creating the VCAPn voltage. Here, the current is recycled so that the current DAC 401 is always ON and the current is steered either in the Cp or Cn capacitors. By such recycling of current, a better performance for the current source is achieved (i.e., the devices operate always in the same region, and no power spike are created in the circuit). This technique also minimizes the charge injected by the switches when they turn ON or OFF. In this embodiment, the threshold comparator operates always in a region where the slope of the waveform is the same independently on the bit code. In such an embodiment, the jitter performance is independent on the input phase selected.

For capacitor Cn, between t2 and t3, when In and Qn are both '0' capacitor Cn is in reset, and all of its charge goes to ground, bringing the VCAPn voltage to 0. During this time, switch RESn is closed. Between t3 and t4, when In=1 and Qn=0, switch SW1 is closed (and switch SW0 is open) and capacitor Cn starts charging (i.e., node VCAPp begins to charge up) with a constant current Qcurr covering the segment 'f' to 'g' (note that the slope of this segment between t3 and t4 depends on how big Qcurr is and so it depends on the bit code). During this time, switch RESn is open.

Between t4 and t5, when In=1 and Qn=1, switch SW1 is still closed but now switch SW0 is also closed allowing Qcurr to be added to Qcurr for integration. During this time segment, the slope of VCAPn is constant (because the current is the maximum current of DAC 401 with all the DAC cells turned ON). In this case, the voltage of VCAPn goes from 'g' to T.

Between t5 and t6, when In=0 and Qn=1, switch SW1 is open and switch SW0 is still closed covering segment T to 'j.' Here, voltage at 'f' (which is '0') and voltage at T are always constant independent on the DAC code (i.e., independent of value of Bit[n:0]). The crossing with the threshold VTHn instead changes linearly with the DAC code, ranging from $h_1$ to $h_4$, and covering the full quarter.

For fast settling of the output, unlike other current integrating techniques, the voltage amplitude at the input of the comparators (404a and 404b) is constant (i.e., it does not change depending on the phase selected), eliminating the need of a common mode controller (which would make the settling time much longer). Here, the three integration cycles are followed by a reset cycle which erases any memory of the previous integration phase as well as any accumulated jitter. In one embodiment, at the changing of a quadrant only one switch for the positive capacitor and one switch for the negative capacitor change. In such an embodiment, disturbance in the phase is reduced, and the DAC also changes only by one code at the crossing of a quadrant.

One non-limiting advantage of the embodiments is that the phase plot is substantially linear (i.e., it depends on the integration of a constant current on a capacitor which is linear by definition), and substantially scalable with data rate. In one embodiment, PI 101 can be designed for the maximum speed and if lower speed is required it is sufficient to lower the DAC unit current and or increasing the capacitance of capacitors Cp and Cn in order to maintain the same voltage span. The embodiment of PI 101 also achieves very high resolution (e.g., 256 steps with a resolution of 0.5 ps). In one embodiment, when higher resolution is desired capacitance size of capacitors Cp and Cn can be increased (and/or DAC current can be lowered). In such an embodiment, DAC size can be increased to the desired number of steps per quadrant.

Unlike other Digital PI implementations which manipulate the slope of the rising and falling edges to compensate for duty-cycle correction, some embodiments provide the correction embedded in the architecture itself with no extra area and/or drawbacks. Changing the slope of the rising and/or falling edges to correct for duty-cycle requires extra hardware, usually implemented outside of the DPI itself, and it degrades the jitter performance on the DPI. Some embodiments can correct for duty-cycle by changing the value of VTHp respect to VTHn.

For example, an increase in VTHp (and/or a decrease in VTHn) may result in a smaller duty-cycle, while a decrease in VTHp (and/or an increase in VTHn) may create a bigger duty-cycle. In one embodiment, DCD 102 can directly control the current DACs 403a and 403b which generate VTHp and VTHn without the need of any extra hardware, and without degrading the circuit jitter performance in any way.

Figure 6:
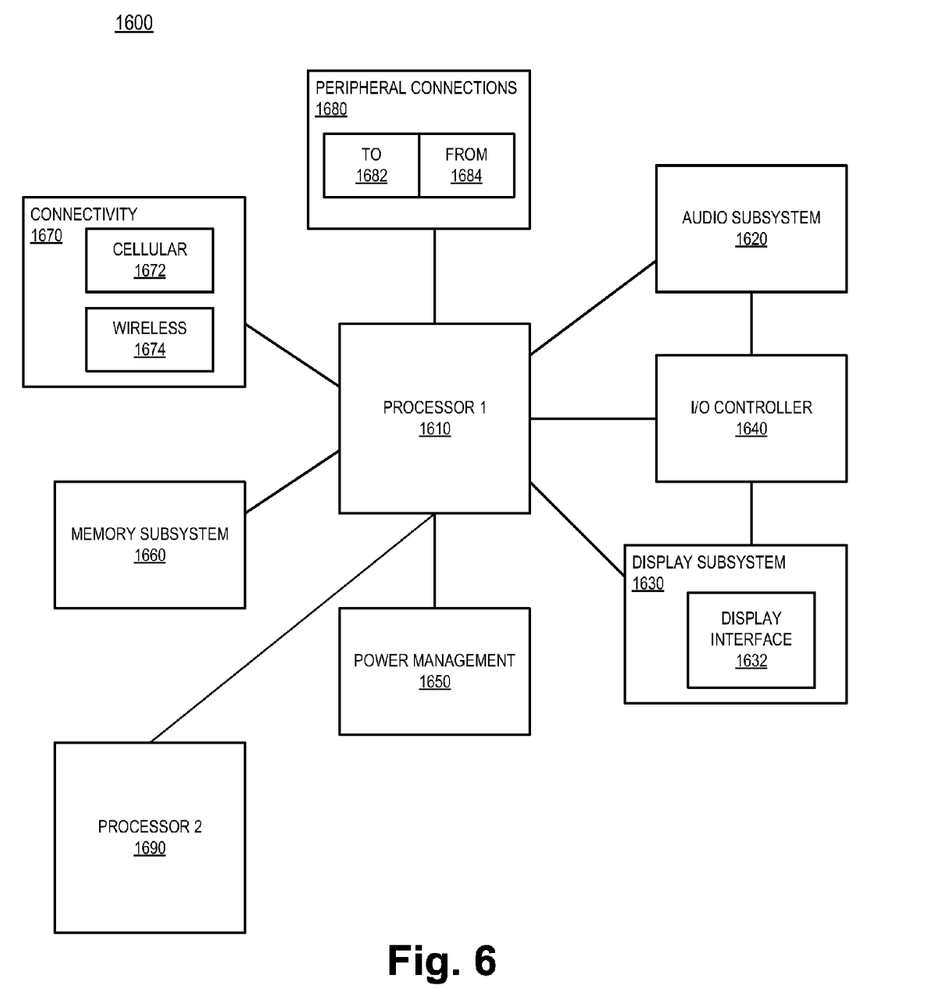
FIG. 6 is a smart device or a computer system or a SoC (System-on-Chip) having the PI with integrated DCC, according to one embodiment of the disclosure.

FIG. 6 is a smart device or a computer system or an SoC (System-on-Chip) having the PI with integrated DCC, according to one embodiment of the disclosure. It is pointed out that those elements of FIG. 6 having the same reference numbers (or names) as the elements of any other figure can operate or function in any manner similar to that described, but are not limited to such.

FIG. 6 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 apparatus having the PI with integrated DCC described with reference to embodiments. Other blocks of the computing device 1600 may also include apparatus having the PI with integrated DCC described with reference to embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. Processor 1690 may be optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or an element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a current steering digital-to-analog converter (DAC) to receive a digital bus to control current steering; a plurality of switches each of which is controllable by a clock signal and each of which is coupled to the DAC, the plurality of switches are operable to provide a first current and a second current; an integrator which is operable to be reset, the integrator coupled to the plurality of switches; and an output stage coupled to the integrator to provide rising and falling edges of an output signal.

In one embodiment, the current steering DAC comprises: an 'N' number of DACs to receive 'N' number of bits of the digital bus, each bit to control a switch in a corresponding DAC from the 'N' number of DACs, where 'N' is an integer, and wherein each DAC is operable to provide the first current or the second current according to an operation of the switch. In one embodiment, the plurality of switches comprises: a first switch coupled to receive the first current; and a second switch coupled to receive the second current, wherein the first and second switches have a first common node. In one embodiment, the plurality of switches comprises: a third switch coupled to receive the first current; and a fourth switch coupled to receive the second current, wherein the third and fourth switches have a second common node. In one embodiment, the integrator comprises: a first capacitor coupled to the first common node and to ground; and a fifth switch coupled in parallel to the first capacitor, wherein the fifth switch is operable to reset the first capacitor by electrically shorting the first common node to ground.

In one embodiment, the integrator comprises: a second capacitor coupled to the second common node and to ground; and a sixth switch coupled in parallel to the first capacitor, wherein the sixth switch is operable to reset the second capacitor by electrically shorting the second common node to ground. In one embodiment, the apparatus further comprises a duty cycle corrector (DCC) to provide a first adjustable threshold voltage and a second adjustable threshold voltage, wherein the first adjustable threshold voltage is different from the second adjustable threshold voltage. In one embodiment, the output stage comprises: a first comparator to compare voltage on the first common node with the first adjustable threshold voltage, the first comparator to generate a first result; and a second comparator to compare voltage on the second common node with the second adjustable threshold voltage, the second comparator to generate a second result.

In one embodiment, the output stage further comprises a set-reset (SR) latch, wherein the SR latch to receive the first and second results, and wherein the SR latch to generate the rising and falling edges of the output signal. In one embodiment, the DCC comprises: a first current source to provide the first adjustable threshold voltage, wherein the first current source is operable to adjust the first adjustable threshold voltage using a first digital control bus. In one embodiment, the DCC comprises: a second current source to provide the second adjustable threshold voltage, wherein the second current source is operable to adjust the second adjustable threshold voltage using a second digital control bus.

In another example, a system is provided which comprises: a memory; and a processor coupled to the memory, the processor including a phase interpolator according to the apparatus discussed above. In one embodiment, the system further comprises a wireless interface for allowing the processor to communicatively couple to another device. In one embodiment, the apparatus further comprises a display unit. In one embodiment, the phase interpolator is part of a clock data recovery (CDR) circuit.

In another example, a phase interpolator is provided which comprises: a current steering digital-to-analog converter (DAC) to receive a digital bus to control current steering; a switch capacitor network to integrate currents from the DAC, the switch capacitor network having switches which are controllable by a plurality of digital clock signals; an output stage to compare the integrated currents against at least two threshold voltages and to generate an output signal; and a duty cycle corrector (DCC) operable to adjust the at least two threshold voltages to modify duty cycle of the output signal.

In one embodiment, the current steering DAC comprises: an 'N' number of DACs to receive 'N' number of bits of the digital bus, each bit to control a switch in a corresponding DAC from the 'N' number of DACs, where 'N' is an integer, and wherein each DAC is operable to provide the first current or the second current according to an operation of the switch. In one embodiment, the switch capacitor network comprises: a first switch coupled to receive the first current; and a second switch coupled to receive the second current, wherein the first and second switches have a first common node. In one embodiment, the switch capacitor network comprises: a third switch coupled to receive the first current; and a fourth switch coupled to receive the second current, wherein the third and fourth switches have a second common node.

In another example, a system is provided which comprises: a memory; and a processor coupled to the memory, the processor including a phase interpolator according to the phase interpolator discussed above. In one embodiment, the system further comprises a wireless interface for allowing the processor to communicatively couple to another device. In one embodiment, the apparatus further comprises a display unit. In one embodiment, the phase interpolator is part of a clock data recovery (CDR) circuit.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
 a current steering digital-to-analog converter (DAC) to receive a digital bus to control current steering;
 a plurality of switches each of which is controllable by a clock signal and each of which is coupled to the DAC, the plurality of switches are operable to provide a first current and a second current;
 an integrator which is operable to be reset, the integrator coupled to the plurality of switches; and
 an output stage coupled to the integrator to provide rising and falling edges of an output signal.

2. The apparatus of claim 1, wherein the current steering DAC comprises:
an 'N' number of DACs to receive 'N' number of bits of the digital bus, each bit to control a switch in a corresponding DAC from the 'N' number of DACs, where 'N' is a positive non-zero integer, and wherein each DAC is operable to provide the first current or the second current according to an operation of the switch.

3. The apparatus of claim 1, wherein the plurality of switches comprises:
a first switch coupled to receive the first current; and
a second switch coupled to receive the second current, wherein the first and second switches have a first common node.

4. The apparatus of claim 3, wherein the plurality of switches comprises:
a third switch coupled to receive the first current; and
a fourth switch coupled to receive the second current, wherein the third and fourth switches have a second common node.

5. The apparatus of claim 4, wherein the integrator comprises:
a first capacitor coupled to the first common node and to ground; and
a fifth switch coupled in parallel to the first capacitor, wherein the fifth switch is operable to reset the first capacitor by electrically shorting the first common node to ground.

6. The apparatus of claim 5, wherein the integrator comprises:
a second capacitor coupled to the second common node and to ground; and
a sixth switch coupled in parallel to the second capacitor, wherein the sixth switch is operable to reset the second capacitor by electrically shorting the second common node to ground.

7. The apparatus of claim 6 further comprises a duty cycle corrector (DCC) to provide a first adjustable threshold voltage and a second adjustable threshold voltage, wherein the first adjustable threshold voltage is different from the second adjustable threshold voltage.

8. The apparatus of claim 7, wherein the output stage comprises:
a first comparator to compare voltage on the first common node with the first adjustable threshold voltage, the first comparator to generate a first result; and
a second comparator to compare voltage on the second common node with the second adjustable threshold voltage, the second comparator to generate a second result.

9. The apparatus of claim 8, wherein the output stage further comprises a set-reset (SR) latch, wherein the SR latch to receive the first and second results, and wherein the SR latch to generate the rising and falling edges of the output signal.

10. The apparatus of claim 7, wherein the DCC comprises:
a first current source to provide the first adjustable threshold voltage, wherein the first current source is operable to adjust the first adjustable threshold voltage using a first digital control bus.

11. The apparatus of claim 10, wherein the DCC comprises:
a second current source to provide the second adjustable threshold voltage, wherein the second current source is operable to adjust the second adjustable threshold voltage using a second digital control bus.

12. A phase interpolator comprising:
a current steering digital-to-analog converter (DAC) to receive a digital bus to control current steering;
a switch capacitor network to integrate currents from the DAC, the switch capacitor network having switches which are controllable by a plurality of digital clock signals;
an output stage to compare the integrated currents against at least two threshold voltages and to generate an output signal; and
a duty cycle corrector (DCC) operable to adjust the at least two threshold voltages to modify duty cycle of the output signal.

13. The phase interpolator of claim 12, wherein the current steering DAC comprises:
an 'N' number of DACs to receive 'N' number of bits of the digital bus, each bit to control a switch in a corresponding DAC from the 'N' number of DACs, where 'N' is a positive non-zero integer, and wherein each DAC is operable to provide a first current or a second current according to an operation of the switch.

14. The phase interpolator of claim 12, wherein the switch capacitor network comprises:
a first switch coupled to receive the first current; and
a second switch coupled to receive the second current, wherein the first and second switches have a first common node.

15. The phase interpolator of claim 14, wherein the switch capacitor network comprises:
a third switch coupled to receive the first current; and
a fourth switch coupled to receive the second current, wherein the third and fourth switches have a second common node.

16. A system comprising:
a memory;
a processor coupled to the memory, the processor including a phase interpolator comprising:
a current steering digital-to-analog converter (DAC) to receive a digital bus to control current steering;
a plurality of switches each of which is controllable by a clock signal and each of which is coupled to the DAC, the plurality of switches are operable to provide a first current and a second current;
an integrator which is operable to be reset, the integrator coupled to the plurality of switches; and
an output stage coupled to the integrator to provide rising and falling edges of an output signal; and
a wireless interface for allowing the processor to communicatively couple to another device.

17. The system of claim 16 further comprises a display unit.

18. The system of claim 16, wherein the phase interpolator is part of a clock data recovery (CDR) circuit.

19. The system of claim 16, wherein the current steering DAC comprises:
an 'N' number of DACs to receive 'N' number of bits of the digital bus, each bit to control a switch in a corresponding DAC from the 'N' number of DACs, where 'N' is a positive non-zero integer, and wherein each DAC is operable to provide the first current or the second current according to an operation of the switch.

20. The system of claim 16, wherein the phase interpolator further comprises a duty cycle corrector.

* * * * *